United States Patent
Furukawa et al.

[11] Patent Number: 5,288,365
[45] Date of Patent: Feb. 22, 1994

[54] METHOD FOR GROWING A SILICON CARBIDE SINGLE CRYSTAL

[75] Inventors: Katsuki Furukawa, Sakai; Yoshimitsu Tajima; Akira Suzuki, both of Nara, all of Japan

[73] Assignee: Sharp Kabushiki Kaisha, Osaka, Japan

[21] Appl. No.: 855,376

[22] Filed: Mar. 20, 1992

[30] Foreign Application Priority Data

Mar. 22, 1991 [JP] Japan .................. 3-057487

[51] Int. Cl.$^5$ ............................. C30B 25/00
[52] U.S. Cl. ...................... 156/614; 156/612; 437/100
[58] Field of Search ............... 156/603, 612, 613, 614, 156/620.72, DIG. 64, DIG. 89, DIG. 98, DIG. 102, DIG. 103

[56] References Cited

U.S. PATENT DOCUMENTS

| | | | |
|---|---|---|---|
| 4,897,149 | 1/1990 | Suzuki et al. | 156/610 |
| 4,960,720 | 10/1990 | Shimbo | 156/610 |
| 4,963,423 | 10/1990 | Sekiguchi et al. | 156/610 |
| 5,026,454 | 6/1991 | Paramenter et al. | 156/610 |
| 5,037,502 | 8/1991 | Suzuki et al. | 156/610 |
| 5,230,768 | 7/1993 | Furukawa et al. | 156/612 |

OTHER PUBLICATIONS

Tairov et al., *Journal of Crystal Growth* (1981) 52:146–150.
Ziegler et al., *IEEE Transactions on Electron Devices* (1983) ED-30(4):277–281.

*Primary Examiner*—Robert Kunemund
*Assistant Examiner*—Felisa Garrett
*Attorney, Agent, or Firm*—Morrison & Foerster

[57] ABSTRACT

A method for growing a silicon carbide single crystal on a seed crystal using a molecular beam source in vacuo by means of a molecular beam epitaxy, wherein a material in the molecular beam source is silicon carbide. A silicon molecular beam source and/or an impurity molecular beam source for doping may be further used. Temperatures of the silicon carbide molecular beam source, the silicon molecular beam source, the impurity molecular beam source and the seed crystal are independently controlled. Vapor compositions are controlled by the silicon carbide molecular beam source, the silicon molecular beam source and the impurity molecular beam source.

8 Claims, 1 Drawing Sheet

METHOD FOR GROWING A SILICON CARBIDE SINGLE CRYSTAL

BACKGROUND OF THE INVENTION

1. Field of the Invention

The present invention relates to a method for growing a silicon carbide single crystal, and more particularly, to a method for growing a silicon carbide single crystal by means of molecular beam epitaxy.

2. Description of the Prior Art

Silicon carbide is a material for a semiconductor having a wide forbidden bandgap of 2.2 eV–3.3 eV, at 300° K. Silicon carbide is desirable as a material for a visible short wavelength light emitting device (especially emitting blue), since such a semiconductor made from silicon carbide can become either a p-type or a n-type depending upon whether impurities are added. Furthermore, silicon carbide is exceedingly stable thermally, chemically and mechanically, and has an advantageous characteristic of a strong radiation damage resistance.

On the other hand, semiconductor elements using conventional materials such as silicon are difficult to use under a severe condition, especially at a high temperature, with a high power density capability, or with being irradiated by radiation. Therefore, semiconductor elements using silicon carbide are desirable for use under the above-mentioned severe conditions in a wide variety of applications, for example, for a rectifier, a radiation detector, an ultraviolet detector, a junction and MOS type field effect transistor (FET), various power elements, and for a light emitting diode (LED).

However, a crystal growth technique for a stable supply of large silicon carbide single crystals having high quality on a commercial scale has not yet been established. This is because a silicon carbide crystal is difficult to grow due to its thermal and mechanical stability. Therefore, although silicon carbide is a material for a semiconductor with many advantages and possibilities as is described above, it has been difficult to put to practical use.

The recrystallization method and the epitaxy method are known methods for growing silicon carbide single crystals. As for the recrystallization method, silicon carbide single crystals conventionally have been grown on a laboratory scale using the sublimation recrystallization method (Lely method) at a high temperature of 2,500° C. or more. In this method, SiC powder in a graphite crucible is vaporized by heating in an Ar gas, and then is transferred to a low temperature portion to be recrystallized, thereby obtaining thin plate crystals, most of which are 6H-SiC, with a maximum thickness of about 10 mm in about 6 hours.

However, since these crystals are grown on an abiogenetic core, the shapes are not constant and the sizes are limited. Therefore, crystals with high quality cannot be grown.

Alternately, in the epitaxy method the vapor phase epitaxy, the liquid phase epitaxy and the molecular beam epitaxy are included in the epitaxy. In this method, a silicon carbide crystal obtained in the Lely method is used as a substrate (a seed crystal) on which silicon carbide single crystals are further grown to obtain silicon carbide single crystals that are large enough to produce semiconductor elements.

However, the single crystals obtained in the above methods still are relatively small, and it is difficult to regulate the sizes and the shapes thereof with high accuracy. Furthermore, it is also difficult to regulate the crystal structures, such as 4H-, 6H-, or 3C-modifications, of silicon carbide, and to regulate the impurity concentration.

In order to solve the above-mentioned problems, a modified Lely method has been introduced. In 15 the the modified Lely method, single crystals are grown on a seed crystal in vacuo of about 1.5 torr so as to obtain ingot single crystals of silicon carbide. (See Y. M. Tairov and V. F. Tsvetkov, *J. Crystal Growth*, 52: 146–150 (1981); G. Ziegler, et al., IEEE, ED-30:277–281 (1983)). In the modified Lely method, silicon carbide single crystals are grown in a graphite crucible using silicon carbide as a source material with the following serving as parameters: (1) the temperature of the seed crystal; (2) the temperature gradient of the seed crystal and the material; and (3) the pressure in growing. Accordingly, silicon carbide single crystals can be grown with regulating the crystal structures and shapes to be grown.

However, the change with time in the sublimation condition of the material, that is, the components of the substance evaporated from the source material, causes a difference in the growing conditions between in the initial stage and in the stage just before finishing. For example, the sublimation of silicon carbide (SiC) generates molecular seeds of $SiC_2$, $Si_2C$, Si and C. At a certain temperature, the seeds of the Si group sublimate first, and when the growth is finished, only carbon (C) may sublimate and grow.

Accordingly, various crystal structures are produced and large silicon carbide single crystals are difficult to obtain.

On the other hand, in the conventional molecular beam epitaxy using a material gas including silicon (Si) and carbon (C), the growth rate is small and only 3C(B)-silicon carbide films can be obtained. The epitaxy using SiC has not been known so far.

SUMMARY OF THE INVENTION

The method for growing a silicon carbide single crystal of this invention, which overcomes the above-discussed and numerous other disadvantages and deficiencies of the prior art, relates to growing a silicon carbide single crystal on a seed crystal using a molecular beam source in vacuo by means of a molecular beam epitaxy, wherein a material in the molecular beam source is silicon carbide.

In a preferred embodiment, a silicon molecular beam source is further used.

In a preferred embodiment, an impurity molecular beam source for doping is further used.

In a preferred embodiment, temperatures of the silicon carbide molecular beam source, the silicon molecular beam source, the impurity molecular beam source and the seed crystal are independently controlled.

In a preferred embodiment, vapor compositions are controlled by the silicon carbide molecular beam source, the silicon molecular beam source and the impurity molecular beam source.

Thus, the invention described herein makes possible the objectives of (1) providing a method for easily obtaining silicon carbide having a desired crystal structure, (2) providing a method for easily forming a silicon carbide crystal having a pn junction layer by controlling impurity concentration, (3) providing a silicon carbide crystal usable as a seed crystal for the vapor phase or the liquid phase epitaxy of silicon carbide, and (4)

providing a method for growing silicon carbide crystals for use in semiconductor devices on a commercial scale.

BRIEF DESCRIPTION OF THE DRAWING

This invention may be better understood and its numerous objects and advantages will become apparent to those skilled in the art by reference to the accompanying drawing as follows.

DESCRIPTION OF THE PREFERRED EMBODIMENTS

Figure 1:
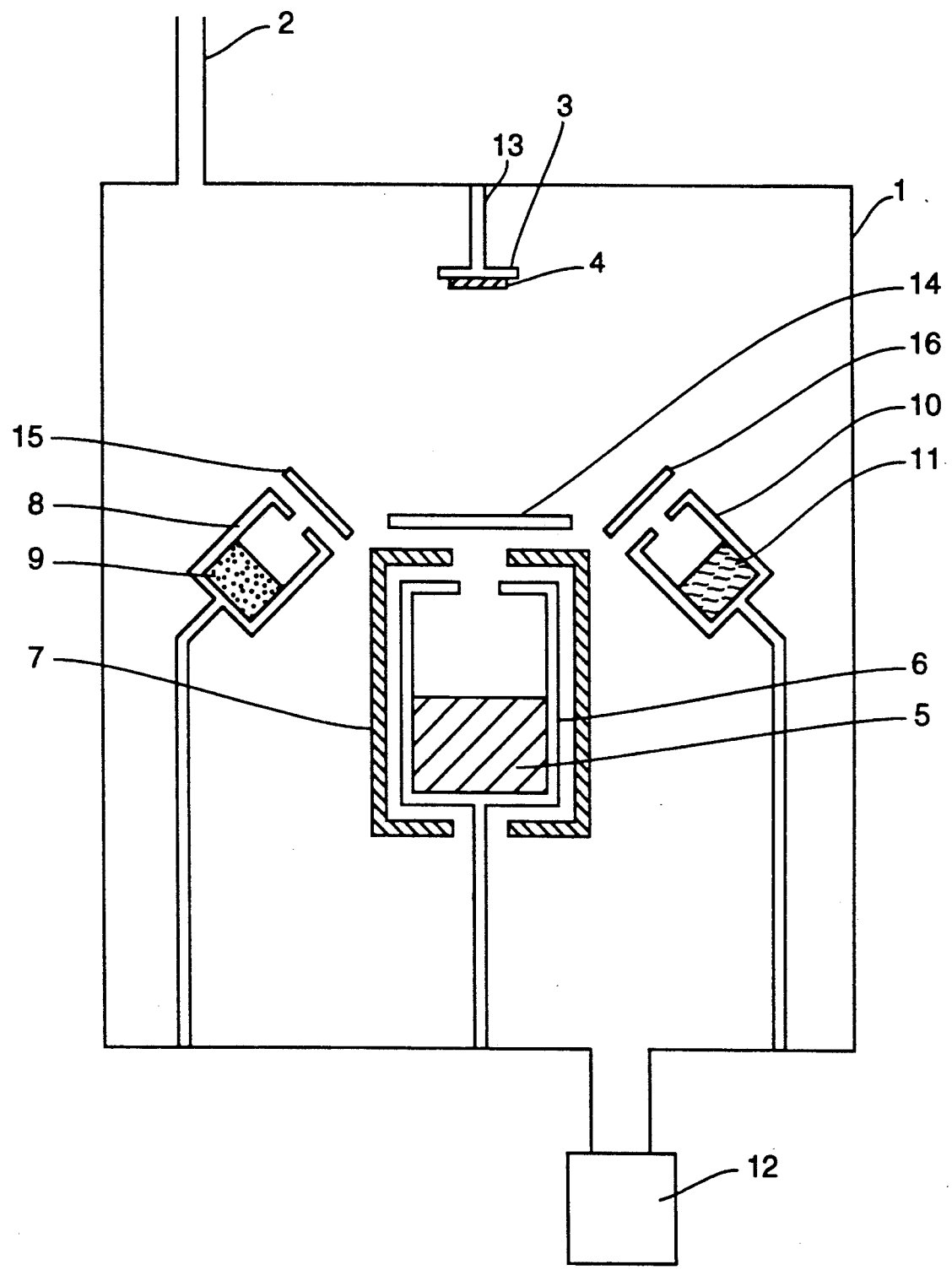
FIG. 1 is a block diagram of a crystal growth part of a device used in Examples 1 to 3 of the growth method of this invention.

Referring to FIG. 1, concrete embodiments of the present invention will now be described. FIG. 1 is an example of a device for growing silicon carbide single crystals by molecular beam epitaxy using silicon carbide as a material in accordance with the growth method of the present invention. The crystal growth device will now be described.

The crystals are epitaxially grown on a silicon carbide seed single crystal 4 by evaporating a material, such as silicon carbide powder 5. The silicon carbide seed single crystal 4 is installed in a vacuum chamber 1 on a substrate holder/heater 3 supported by a leg 13 for adjusting the distance from materials. Any single crystal with a desirable crystal structure that is obtainable in the prior art or the present method may be used as the silicon carbide seed single crystal 4.

The silicon carbide powder 5 is preferably powdery so as to have high purity and to be easily evaporated at a predetermined temperature and pressure. Alternatively, a solid may be used.

The substrate holder/heater 3 is for keeping a silicon carbide seed single crystal 4 at an appropriate temperature for growing a desired crystal structure. Preferably, the temperature can be freely set up to 2830° C., which is the decomposition temperature of silicon carbide. Moreover, the position of the substrate holder/heater 3 is adjustable by the leg 13 so as to keep an appropriate distance between materials in order to prevent the material vapor from condensing due to a steep temperature gradient.

The silicon carbide powder 5, as a material, is contained in a molecular beam generator/heater 6. A graphite heat shield 7 is provided around the molecular beam generator/heater 6, so as not to be influenced by the temperatures of the other generators or of the chamber. Additionally, a molecular beam generator/heater 8 containing silicon 9, and another molecular beam generator/heater 10 containing an impurity 11 such as aluminum (Al) or gallium (Ga), are provided in the vacuum chamber 1. The temperature in each of the molecular beam generators/heaters 6, 8 and 10 is independently adjustable, and can be raised high enough to evaporate the contents. The silicon 9 and the impurity 11 preferably are powdery, but solids also may be used.

A gas inlet 2, an inflow port of carrier gas, is provided on the upper surface of the stainless vacuum chamber 1 and a vacuum pump 12 is connected to the opposite surface. As a result, the vacuum chamber 1 can be evacuated to a desired extent of vacuum. Any carrier gas that is used in the ordinal vapor phase epitaxy, such as argon and hydrogen, can be used as the gas introduced through the gas inlet 2. Any vacuum pump that can evacuate the chamber to the necessary vacuum extent for the present invention, such as an oil diffusion pump or a turbo molecular pump, can be used.

Shutters 14, 15 and 16 can be independently opened after each of the contents of the molecular beam generators/heaters 6, 8 and 10 is heated to a predetermined temperature, respectively, thereby evaporating silicon carbide, silicon carbide/silicon, and silicon carbide/silicon/impurity, respectively, into the vacuum chamber. At the same time, the shutters 14, 15 and 16 prevent undesirable vapor condensation or growth of undesirable crystal structures that may occur on the seed crystal before obtaining the predetermined temperature.

According to the above-mentioned growth device of the present invention, excellent silicon carbide single crystals can be controllably obtained.

The temperature of the seed crystal 4 is preferably 1100° C. to 2400° C. to regulate the crystal structures of the silicon carbide single crystals. The temperature of 1800° C. to 2400° C. is preferable for $\alpha$-SiC, and 1100° C. to 2000° C. is preferable for SiC. For example, 6H- and 4H-silicon carbide crystals of the hexagonal system can grow at the temperature of the seed crystal of 1800° C. to 2500° C. When silicon carbide powder is used as a material, the preferable temperature is 1800° C. to 2500° C.

Furthermore, a constant supply of the most appropriate vapor composition during the growth period prevents only the carbon type from being grown and improves the uniformity in quality of the production. Among the molecular beam sources of the present invention, the silicon carbide molecular beam source generates molecular beams of $Si_2C$, $SiC_2$, Si and C as well as of SiC. The silicon molecular beam source is used to correct the change in composition of Si and C caused by generation of the molecular beams of other than SiC. The silicon molecular beam source of the present invention is used for controlling the partial pressure of the Si group among the molecular beams of $Si_2C$, $SiC_2$, Si and C generated from the silicon carbide material. This is a solution of the problem of the modified Lely method that the composition change with the growth time is caused by the contamination by carbon impurities with the exhaustion of Si. The change of the compositions caused by the carbon impurities contamination with the growth time in the modified Lely method is thus corrected.

The extent of the vacuum during the growth is preferably $10^{-4}$ to $10^{-8}$ torr, which is necessary for generating material vapor at the most appropriate temperature for the crystal growth, that is, for controlling the crystal structures as is described above. In the present invention, since the pressure is regulated independently from the temperatures of the seed crystal and Si molecular beam source, crystals are grown by the pure molecular beam epitaxy. In the conventional method, the vapor is generated by the combination of the sublimation temperature and pressure of the material, and is condensed on a seed crystal with a lower temperature to proceed the crystal growth due to the effect of the temperature gradient, which is different from the method of the present invention.

As is described above, by controlling the temperatures (that is, the vapor pressure) of the seed crystal and the silicon carbide as a material independently, a number of crystal structures of silicon carbide, such as 6H-, 4H- and 3C-modifications, can be easily regulated.

It is possible to produce a silicon carbide semiconductor device with an excellent electrical property such as a rectifier, a radiation detector, an ultraviolet detector, a junction and MOS type field effect transistor (FET), various power elements and a light-emitting diode (LED), by using the thus obtained silicon carbide single crystal or by growing silicon carbide by liquid phase epitaxy or vapor phase epitaxy using the silicon carbide single crystal as a seed crystal. Furthermore, since silicon carbide single crystals with excellent repeatability can be uniformly obtained in accordance with the present invention as is described above, various semiconductor devices with high electrical and optical properties can be produced in high yield on the industrial scale.

The formation of pn junctions and the control of impurity concentration in the p-layer are easy due to the independent molecular beams for controlling the conductivity type. Thus, the above-mentioned semiconductor devices can be produced using the resultant pn junction layer.

EXAMPLES

FIG. 1 is an example of a device for growing silicon carbide single crystals by molecular beam epitaxy using silicon carbide as a material in accordance with the growth method of the present invention. The crystals are epitaxially grown on a silicon carbide seed single crystal 4 by evaporating silicon carbide powder 5 as a material. The silicon carbide seed single crystal 4 is installed in a vacuum chamber 1 on a substrate holder/heater 3 supported by a leg 13 for adjusting the distance between materials. The silicon carbide powder 5 is contained in a molecular beam generator/heater 6. A graphite heat shield 7 is provided around the molecular beam generator/heater 6 for heat shielding. Additionally, a molecular beam generator/heater 8 containing silicon 9, and another beam generator/heater 10 containing impurity 11, such as aluminum (Al) or gallium (Ga), are provided in the vacuum chamber 1. The intensity of the molecular beams of $Si_2C$, $SiC_2$ and Si, which relate to Si among the molecular beams generated from the silicon carbide 5, is analyzed using mass spectrography. Every time the intensity of Si is decreased, additional Si molecular beam is supplied with the shutter 15 opened, thereby growing SiC constantly and stably. A gas inlet 2, an inflow port of carrier gas, is provided on the upper surface of the stainless vacuum chamber 1 and a vacuum pump 12 is connected to the opposite surface thereof, by which the vacuum chamber 1 can be evacuated to a desired extend of vacuum. Moreover, this evacuation can be used as a monitor for the above described molecular beams that relate to Si.

Concrete examples of the method for growing a silicon carbide single crystal using the foregoing crystal growth device will now be described.

Example 1 : 6H-SiC single crystals

A seed crystal 4 formed from a silicon carbide single crystal of the hexagonal system whose growth surface direction was 5 degrees inclined from the [0001] direction to the [1,1,$\bar{2}$,0] direction was prepared as a seed crystal. The seed crystal 4 was installed on the seed holder/heater 3. Silicon carbide powder 5 with high purity was contained in the molecular beam generator/heater 6 as a material. The silicon carbide powder had a maximum particle diameter of 150 μm and a JIS grain size of #250. The molecular beam generator/heater 6, which was covered with the graphite heat shield 7, was provided in the vacuum chamber 1.

Furthermore, silicon 9 was contained in the molecular beam generator/heater 8, which also was provided in the vacuum chamber 1. A crucible made from boron nitride (BN) was used as the molecular beam generator/heater. The vacuum chamber 1 was then evacuated to reduce the pressure to $10^{-8}$ torr or less by the vacuum pump 12.

Then, a slight amount of argon gas (Ar) was introduced through the gas inlet 2. The amount of introduced gas and the extent of the vacuum evacuation were adjusted so as to allow the vacuum chamber 1 to have a vacuum of $10^{-4}$ torr. Thereafter, the molecular beam generator /heater 6 for silicon carbide, the molecular beam generator/heater 8 for Si and the seed holder/heater 3 were heated to be 2000° C., 1500° C. and 1800° C., respectively. The silicon carbide single crystals were then started to grow on the silicon carbide seed crystal 4 by opening a shutter 14 after completing the heating.

After starting the growing, silicon carbide single crystals of a thickness of 3 mm grew in 3 hours. In the case of continuing the growth for more than 3 hours, the intensity of the molecular beams of $Si_2C$, $SiC_2$ and Si, which relate to Si among the molecular beams generated from the silicon carbide 5, are analyzed by a mass spectrography. Every time the intensity of Si is decreased, additional Si molecular beam is supplied with a shutter 15 opened, thereby obtaining as excellent a growing layer as that obtained at the initial stage of the growth, even when the growth continues for a long time.

The resultant silicon carbide single crystals were analyzed by X-ray diffraction, electron diffraction and Raman scattering. It was found that 6H-silicon carbide single crystals of the hexagonal system with high quality were obtained uniformly from the portion near the seed crystal and from the growth surface as well.

Example 2 : pn junction semiconductors

Silicon carbide powder 5 and silicon 9 were provided as in Example 1. Additionally, aluminum (Al) powder 11 as a p-type impurity was contained in the molecular beam generator/heater 10.

Molecular beam generators/heaters 6 and 10 were heated to 2200° C. and 600° C., respectively, in the same manner as in Example 1. At this point, shutters 14 and 16 were closed. A seed crystal 4 was also heated to 2000° C. The same seed crystal, a 6H-silicon carbide single crystal whose growth surface direction was 5 degrees inclined from the [0001] direction to the [1,1,$\bar{2}$,0] direction, was also used in this example. A vacuum chamber 1 was evacuated to have a vacuum of $10^{-4}$ torr in the same way as in Example 1. Non-dope n-type silicon carbide single crystals were started to grow on the seed crystal 4 by opening the shutter 14 with the growth rate of 1.2 mm/h. When a n-type layer with a thickness of 1.2 mm was obtained after the growth for one hour, doping of aluminum was started by opening the shutter 16. P-type silicon carbide single crystals, also with a thickness of 1.2 mm, were grown on the n-type silicon carbide single crystals in one hour.

A laminated film of aluminum and titanium was formed on the thus grown silicon carbide single crystals, thereby forming an ohmic electrode. The resultant structure was found to be a pn junction with an excellent rectification by measuring the electrical characteristic. The carrier concentration in the p-layer was $2 \times 10^{17}$ cm$^{-3}$, which can be controlled to be in the range of $10^{16}$ cm$^{-3}$ to $10^{18}$ cm$^{-3}$ by regulating the temperature of the molecular beam generator/heater 10, which was used as a cell for depositing aluminum in this example. The thus obtained silicon carbide had 4H-single crystals. Additionally, organometal such as trimethylaluminum (TMA) may be used as an impurity.

Example 3: 3C-SiC single crystals

Silicon carbide powder 5 was provided in the same manner as in Example 1. 3C-silicon carbide film was used as a seed crystal. The 3C-silicon carbide used in this example was one with a (100) surface and a thickness of about 30 μm, which was grown in the chemical vapor deposition (CVD) on a Si seed crystal. The pressure in the vacuum chamber 1 was adjusted to $10^{-5}$ torr in the same manner as in Example 1. Then the silicon carbide 5 and a 3C-silicon carbide seed crystal 4 were heated to 1800° C. and 1300° C., respectively. A shutter 14 was opened after obtaining the above temperatures in order to grow silicon carbide single crystals on the seed crystal 4. Silicon carbide single crystals with a thickness of about 1.0 mm were obtained in the growth for 3 hours.

The resultant silicon carbide single crystals were found to be 3C-silicon carbide single crystals with an excellent crystallinity based on the results of the X-ray diffraction and the Raman scattering. The defect density was found to be $10^3 \text{cm}^{-3}$ from the evaluation of the crystal defects. Thus, the 3C-silicon carbide single crystals with better quality than a heteroepitaxial film, the 3C-silicon carbide, which was used as a material in this example, were obtained. Additionally, a (1,1,1) surface may be used as a seed crystal.

It is understood that various other modifications will be apparent to and can be readily made by not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for growing a silicon carbide single crystal on a seed crystal using a plurality of molecular beam sources in vacuo by means of a molecular beam epitaxy, wherein a first material in the molecular beam sources is silicon carbide and wherein a second material in the molecular beam sources is silicon.

2. A method for growing a silicon carbide single crystal according to claim 1, further including the use of an impurity molecular beam source for doping.

3. A method for growing a silicon carbide single crystal according to claim 2, wherein temperatures of the silicon carbide molecular beam source, the silicon molecular beam source, the impurity molecular beam source and the seed crystal are independently controlled.

4. A method for growing a silicon carbide single crystal according to claim 3, wherein vapor compositions are controlled by the silicon carbide molecular beam source, the silicon molecular beam source and the impurity molecular beam source.

5. A method for growing a silicon carbide single crystal on a seed crystal using a molecular beam source in vacuo by means of a molecular beam epitaxy,
   wherein a material in the molecular beam source is a polycrystalline silicon carbide powder; and said seed crystal is a silicon carbide single crystal;
   and further wherein a temperature of said seed crystal is in the range of 1100° C. to 2400° C.; a temperature of said molecular beam source is in the range of 1800° C. to 2500° C.; and the vacuum during the growth is $10^{-4}$ to $10^{-8}$ torr.

6. A method for growing a silicon carbide single crystal according to claim 5,
   wherein a temperature of said seed crystal is 1300° C.; and said silicon carbide single crystal is β form.

7. A method for growing a silicon carbide single crystal according to claim 5,
   wherein a temperature of said seed crystal is in the range of 1800° C. to 2400° C.; and said silicon carbide single crystal is α form.

8. A method for growing a silicon carbide single crystal on a seed crystal using a plurality of molecular beam sources in vacuo by means of a molecular beam epitaxy,
   wherein a material in the molecular beam sources are silicon carbide and silicon; and said seed crystal is a silicon carbide single crystal;
   and further wherein a temperature of said seed crystal is in the range of 1100° C. to 2400° C.; a temperature of said molecular beam source is in the range of 1800° C. to 2500° C.; and the vacuum during the growth is $10^{-4}$ to $10^{-8}$ torr.

* * * * *